(12) United States Patent
Gidon

(10) Patent No.: US 7,943,923 B2
(45) Date of Patent: May 17, 2011

(54) MULTI-LEVEL DATA MEMORISATION DEVICE WITH PHASE CHANGE MATERIAL

(75) Inventor: Serge Gidon, La Murette (FR)

(73) Assignee: Commissariat a l'Energie Atomique, Paris (FR)

( * ) Notice: Subject to any disclaimer, the term of this patent is extended or adjusted under 35 U.S.C. 154(b) by 360 days.

(21) Appl. No.: 12/036,818

(22) Filed: Feb. 25, 2008

(65) Prior Publication Data

US 2008/0217600 A1    Sep. 11, 2008

(30) Foreign Application Priority Data

Mar. 9, 2007    (FR) ...................................... 07 53739

(51) Int. Cl.
*H01L 29/06*    (2006.01)
(52) U.S. Cl. .................................. 257/5; 257/4; 365/163
(58) Field of Classification Search .................. 257/2–5; 438/900, 102–103; 365/129, 163, 148
See application file for complete search history.

(56) References Cited

U.S. PATENT DOCUMENTS

| | | | | |
|---|---|---|---|---|
| 6,635,914 | B2 * | 10/2003 | Kozicki et al. | 257/296 |
| 6,927,410 | B2 * | 8/2005 | Chen | 257/2 |
| 7,227,170 | B2 * | 6/2007 | Ovshinsky | 257/2 |
| 7,679,163 | B2 * | 3/2010 | Chen et al. | 257/537 |
| 2003/0206453 | A1 | 11/2003 | Joo | |
| 2004/0090815 | A1 * | 5/2004 | Tajiri | 365/148 |
| 2004/0151024 | A1 * | 8/2004 | Fricke et al. | 365/177 |
| 2006/0006472 | A1 * | 1/2006 | Jiang | 257/358 |
| 2007/0295948 | A1 * | 12/2007 | Lam et al. | 257/4 |
| 2008/0123397 | A1 * | 5/2008 | Liu | 365/163 |

FOREIGN PATENT DOCUMENTS

EP    1 376 594 A1    1/2004

OTHER PUBLICATIONS

S. Gidon, et al., "Electrical probe storage using Joule heating in phase change media", Applied Physics Letters, American Institute of Physics, vol. 85, No. 26, XP012063948, ISSN: 0003-6951, Dec. 27, 2004, pp. 6392-6394.
Ferdinando Bedeschi, et al., "4-Mb MOSFET-Selected μ Trench Phase-Change Memory Experimental Chip", IEEE Journal of Solid-State Circuits, vol. 40, No. 7, Jul. 2005, pp. 1557-1565.
P. Vettiger, et al., "The "Millipede" More than one thousand tips for future AFM data storage", IBM J. Res. Develop., vol. 44, No. 3, May 2000, pp. 323-340.
European Search Report issued Jul. 30, 2010, in Patent Application No. 08102287.3.

* cited by examiner

*Primary Examiner* — Zandra Smith
*Assistant Examiner* — Mark W Tornow
(74) *Attorney, Agent, or Firm* — Oblon, Spivak, McClelland, Maier & Neustadt, L.L.P.

(57) ABSTRACT

A data memorization device including at least: a stack of layers including at least one memory layer based on a phase change material arranged between at least two insulating layers, placed on a substrate, a plurality of columns arranged in the stack of layers, and passing through each layer of the stack, each of the columns being based on at least one electrically conducting material, and a plurality of memorization elements formed by annular portions of the at least one memory layer surrounding columns.

27 Claims, 6 Drawing Sheets

MULTI-LEVEL DATA MEMORISATION DEVICE WITH PHASE CHANGE MATERIAL

TECHNICAL DOMAIN AND PRIOR ART

The invention relates to the field of data recording, and more particularly a device for memorisation of multi-level data.

In the field of data processing, increasingly large capacity memories are necessary. Several types of memory are used to save data including mass memories, for example a hard disk or an optical disk, and dynamic memories, for example a DRAM (Dynamic Random Access Memory) or Flash type memory. Dynamic memories are also called <<solid memories>> because there are no moving mechanical parts.

Document <<4-Mb MOSFET-Selected μTrench Phase-Change Memory Experimental Chip>> by F. Bedeschi et al., IEEE J. Solid-State Circuits, vol. 40, No. 7, July 2005, describes a memory based on a phase change material (also called a PC RAM memory) for which operation is based on a modification of the crystallinity state of a volume of the phase change material (chalcogenide), inserted between two electrodes. The change from one phase to another, in other words from the crystalline state to the amorphous state or vice versa, is obtained by Joule heating, by means of a current pulse of variable magnitude. The state of the memory is detected by reading the resistance of the volume of the phase change material.

However, with this type of memory, increases in the storage capacity are related solely to the increase in the surface integration density of the storage elements, in other words a reduction in the size of the storage elements. Furthermore, in order to access data efficiently, the access bus must be designed to minimise electromagnetic couplings during addressing so as to accept ever increasing operating frequencies to have a short access time, which could create problems during subsequent changes in integrating such memories.

There are also so-called <microdot>> memories comprising a storage support addressed through a mobile microdots network. These microdots can cause local modifications to physicochemical properties (for example mechanical, thermal or electrical) on the surface of the storage support to write information on it. This information can then be read by the detection of modifications to physicochemical properties made on the support surface. In this type of memory, the ends of the microdots define the limit of the surface density of the storage elements. The surface density obtained (for example of the order of 0.15 Tbits/cm$^2$) is such that these memories are suitable for high capacity applications in a small volume, for example for nomad devices. Furthermore, since their manufacturing technology does not require any advanced lithographic means, their manufacturing cost remains fairly low.

The document <<The "Millipede"—More than one thousand tips for future AFM data storage>> by P. Vettiger et al., IBM J. Res. Develop., vol. 44, No. 3, May 2000, pages 323 to 340, describes a microdot memory using atomic force microscopy (AFM) techniques on the surface of a storage layer based on polymer materials. The information stored in this memory is in the form of holes made in the storage layer.

But once again, increases in the storage capacity of such microdot memories are related solely to the increase in the surface integration density of the storage elements and the reduction in the dimensions of the ends of the microdots. Furthermore, this type of memory requires that the MEMS positioning precision controlling the microdots should increase in proportion to the increase in the surface integration density of storage elements, which could be an obstacle in the future.

The document <<Electrical probe storage using Joule heating in phase change media>> by S. Gidon et al., Applied Physics Letters, vol. 85, No. 26, 27 Dec. 2004, describes a microdots memory using a phase change material. The crystallisation state is modified by the Joule effect (electrical mode) on a zone of the media designated by a dot. The crystallinity state of the surface is read by detection of local conduction. However, this type of memory requires that the positioning precision of the MEMS controlling the microdots should increase proportionally to the increase in the surface integration density of the storage elements, which could create an obstacle during an increase in the storage capacity. Furthermore, this type of memory is not reversible, since the stored data can no longer be erased afterwards.

PRESENTATION OF THE INVENTION

One purpose of this invention is to propose a device for which the storage capacity is not solely related to the surface integration density of storage elements of the device and to the dimensions of the surface of the storage device.

To achieve this, this invention proposes a data memorisation device comprising at least:
- a stack of layers comprising at least one memory layer based on a phase change material arranged between at least two electrically isolating or dielectric layers placed on a substrate,
- a plurality of columns arranged in the stack of layers, passing through each layer of this stack, each of the columns being based on at least one electrically conducting material.

Thus, a memorisation support is used composed of multiple memory levels. A memorisation element is formed at each intersection of a column with a memory layer of the stack.

A three-dimensional integration of storage circuits is made with a stack of memory zones, such that the increase in the storage capacity is no longer related only to the increase in the surface integration density of the storage elements of the device.

Therefore with such a device, it is possible to have large low cost storage capacities in a small volume without increasing the surface area of each memory layer. This multi-level memory architecture based on a phase change material can be adapted to form a microdots memory or a solid memory.

Furthermore, such a memorisation device has the advantage particularly of making it possible to continue to operate even if one or several memory layers become defective, due to other memory layers.

Finally, unlike a conventional PCRAM structure in which the contact pads are usually circular, the column structure passing through the layers of such a device can be used for example to obtain cylindrical shaped contact zones between the columns and the memory layers, with smaller areas, thus inducing a higher current density at these contact surfaces. Such a current density is favourable to local heating enabling the material in one portion of the memory layer located around a column to change phase.

For example, in the case of columns comprising sections forming disks with radius r, the contact surface between one of the columns and one of the memory layers with thickness e may be equal to $2 \times \pi \times r \times e$.

This surface is much smaller than the surface of a contact pad on a conventional PCRAM structure that is equal to $\pi \times r^2$ when the thickness e is less than r/2, which is easily obtained with a layer with a nanometric thickness e, for example equal to about 3 nm, and radius r equal to at least 10 nm.

The device can comprise a plurality of memorisation elements formed by annular portions of the memory layer surrounding the columns.

The device may comprise diodes arranged between each memory layer and each column.

The device may also comprise diodes arranged in the columns, at the insulating layers.

The stack of layers may be formed by an alternation of insulating layers and memory layers.

The device may comprise a plurality of trenches made in the stack and passing through all layers of the stack, forming several portions isolated from each other, in the stack of layers and columns.

Each of the memory layers may be formed from several parts electrically isolated from each other.

The device may also comprise means for applying voltage to the column terminals. These means for applying voltage to the column terminals may comprise a network of mobile microdots and/or a network of conducting lines in contact with the columns and/or a transistor network and/or a multiplexing circuit.

The device may also comprise means for applying voltage to the terminals of memory layers, and/or means for selecting one or several columns and/or means for selecting one or several memory layers.

The means for selecting one or several columns, and/or the means for selecting one or several memory layers may be used by an electronic multiplexing circuit.

The device may comprise current measurement means, such as a current intended to circulate in the columns and/or memory layers, and/or logical address selection means such as a multiplexer. The current measurement means may comprise at least one integrated amplifier and/or one current/voltage converter and/or one threshold comparator and/or one charge/voltage converter (in other words an integrator).

The sections of the columns, in a plane substantially parallel to the main plane of the memory layer can be rectangular, or triangular-shaped or with a disc shape.

This invention also relates to a method of making a data memorisation device, comprising at least the following steps:
  production of a stack of layers on a substrate, comprising at least one memory layer based on a phase change material arranged between at least two insulating layers,
  etching of a plurality of holes in the stack of layers, the holes passing through each layer in the stack,
  production of columns based on at least one electrically conducting material, in the holes.

The steps of making the columns can be such that a plurality of memorizing elements formed by annular portions of the memory layer can surround the columns.

The substrate may comprise an integrated circuit comprising means for measuring the current and/or means for addressing columns and memory layers and/or multiplexing means and/or means for addressing selection.

This invention also relates to a method of making a data memorisation device comprising at least the following steps:
  production of columns on a substrate based on at least one electrically conducting material,
  production of a stack of layers comprising at least one memory layer based on a phase change material arranged between at least two insulating layers on the sub rate, around the columns.

The step of completion of the stack can be such that several memorizing elements formed by annular portions of the memory layer can surround columns.

The method may include a step before the step to make the stack of layers or before the step to make the columns, in which current measurement means are made on the substrate, and/or means for applying voltage to the terminals of the columns such as a network of conducting lines in contact with the columns or intended to be in contact with the columns and/or a network of transistors.

The stack of layers can be made by alternating steps to deposit insulating layers and memory layers, an additional photolithography and etching step possibly being implemented after each deposit of a memory layer to form several parts electrically isolated from each other in this memory layer.

The process may comprise a step between the step to make the stack of layers and the step to make the columns, or after the step to make the stack of layers, in which a plurality of trenches are made in the stack, passing through all layers in the stack and forming several portions isolated from each other, in the stack of layers.

The method may also comprise a step to make diodes on the walls of the holes or around the columns, at each memory layer, for example between the step to etch the plurality of holes in the stack of layers and the step to make the columns. Each diode may be designed to be placed at a memory layer.

The columns may be made by electrochemical deposition and/or by growth of nanotubes or nanowires starting from a catalyst previously deposited in the holes or on the substrate.

The method may for example comprise a step to deposit a layer that is at least partially conducting on the stack and on the columns or on at least on the columns, after the columns have been made.

The method may also comprise a step to produce diodes in the columns, at the insulating layers or around the columns, each diode then being designed to be placed at a memory layer.

The method may comprise a step to make a network of mobile microdots designed to apply voltage to the column terminals.

Finally, the method may comprise a step to make means for selecting one or several columns and/or a step to make means for selecting one or several memory layers.

BRIEF DESCRIPTION OF THE DRAWINGS

This invention will be better understood after reading the description of example embodiments given purely for guidance and in no way limitative with reference to the appended drawings on which.

Identical, similar or equivalent parts of the different figures described below are assigned the same numeric references to facilitate comparisons between one figure and the other.

The different parts shown in the figures are not necessarily shown at a uniform scale, to make the figures more legible.

It should be understood that the different possibilities (variants and embodiments) are not mutually exclusive, and they can be combined with each other.

DETAILED PRESENTATION OF PARTICULAR EMBODIMENTS

Figure 1A:
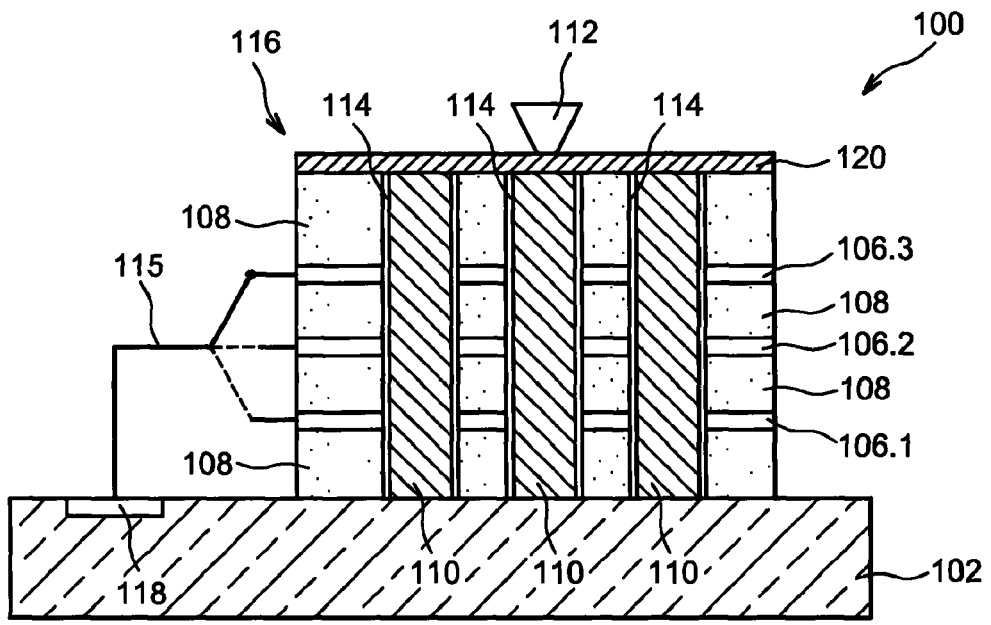
FIGS. 1A and 1B show a sectional view of a part of a memorisation device according to this invention, according to two variants of a first embodiment.

Refer firstly to FIG. 1A that shows a sectional view of a part of a data memorisation device 100 according to a first variant of a first embodiment.

The device 100 comprises a substrate 102, for example based on semiconductor such as silicon, and/or glass and/or plastic. The substrate 102 may also be based on silicon with a (111) or (100) crystalline orientation.

The device 100 also comprises several layers 106.1 to 106.3 based on a phase change material, in other words a material for which the electrical conduction properties can be modified, stacked on substrate 102. Only three layers 106.1 to 106.3 have been shown in FIG. 1A. These layers 106.1 to 106.3 are called <<memory layers>> and are mechanically and electrically isolated from each other and from the substrate 102 by the insulating layers 108, or dielectric layers, based on a material such as silica, and/or silicon nitride and/or a mix of zinc sulphide and/or silicon oxide with a low thermal conductivity, and a thickness between about 10 nanometers and 300 nanometers. The device 100 may comprise a different number of memory layers, for example eight memory layers. For example, the memory layers 106.1 to 106.3 may be based on at least one material in the chalcogenides family, for example GeSe, and advantageously ternary chalcogenides such as $Ge_xSb_yTe_z$ and/or $Ag_xIn_ySb_zTe_t$, and/or hydrogenated amorphous silicon. During production of the device 100, the material in the memory layers 106.1 to 106.3 may be in crystalline phase. The memory layers 106.1 to 106.3 may for example be between 1 nanometer and 30 nanometers thick, and advantageously between about 2 nm and 10 nm, and particularly between about 3 nm and 5 nm thick. In particular, when the material of the memory layers 106.1 to 106.3 is in the chalcogenides family, the choice of the thickness of the memory layers is made by making a compromise between the need to reduce the thickness to increase the confinement of current lines and the fact of having a sufficient thickness so that the material can change state.

In this first embodiment, each memory layer 106.1 to 106.3 is arranged between two insulating layers 108. In general, the device 100 may comprise at least one memory layer arranged between two insulating layers. When the device 100 comprises several memory layers, each memory layer is arranged between two insulating layers.

The device 100 also comprises several columns 110 at least partly based on an electrically conducting material such as Cu and/or TiN, and/or W and/or doped Si. These columns 110 pass through the memory layers 106.1 to 106.3 and the insulating layers 108, for example perpendicularly. Only three columns 110 are shown in FIG. 1A. For example, these columns 110 may have an approximately cylindrical shape and their dimensions may be similar to each other. These columns 110 may also be based on nanotubes composed of carbon and/or a semiconductor such as silicon, for example in the form of nanowires. In the example in FIG. 1A, the columns 110 are at a uniform spacing from each other, for example by a distance of between about 22 nm and 66 nm. For example, the columns 110 may have a circular section with a diameter equal to about 20 nm.

It is also possible that the column section can be of a different shape, for example rectangular, triangular or any other form.

A structure of electronic diodes 114 is formed around each column 110. This structure forms an electronic diode between each memory layer and the column around which the structure is located. Thus, such a structure located around one of the columns 110 prevents a current circulating in one of the memory layers 106.1 to 106.3 from passing into the other memory layers 106.1 to 106.3 through this column 110. In one variant, diodes may be made in the columns 110 between each memory level, in other words at the insulating layers 108.

Each intersection of a column 110 and one of the memory layers 106.1 to 106.3 forms a memorisation element of the device 100 in which information is written and/or read.

The memory layers 106.1 to 106.3 and the insulating layers 108 may be structured into several <<boxes>> or portions arranged in the substrate 102, isolated from each other by vacuum and/or an insulating material. A single box 116 comprising the memory layers 106.1 to 106.3 and insulating layers 108 is shown in the example in FIG. 1A.

The device 100 also comprises a plurality of microdots 112, for example a network of mobile microdots based on at least one electrically conducting material capable of selecting the columns 110 in which the information must be written and/or read by polarising these columns 110 by applying a voltage to the terminals of these columns 110. Only one microdot 112 is shown in FIG. 1A. The number of microdots 112 may for example correspond to the number of boxes 116 in the device 100. The microdots 112 may for example be separated from each other by a distance equal to about 100 μm. This network of microdots 112 may be controlled by column selection means, not shown in FIG. 1A, choosing the column(s) 110 that is (are) to be polarised.

The box structure of the memory layers 106.1 to 106.3 and the insulating layers 108 makes it possible to assure that a limited number of diodes 114 is subjected to inverse polarisation when one of the columns 110 is polarised by applying voltage onto this column 110 through a microdot 112, and prevents the generation of an excessive leakage current. For example, each box 116 may comprise between about 1000 and 1000000 columns 110.

The device 100 in FIG. 1A also comprises an at least partially conducting layer 120 called the <tribology>> layer, for example based on powder carbon made to be conducting by the presence of metallic impurities also in powder form, arranged on the stack of memory layers 106.1 to 106.3 and insulating layers 108, and on the summits of the columns 110. The layer 120 may also be based on silicon carbide (SiC) and/or thin layers of amorphous carbon (<<Diamond Like Carbon>> DLC). The thickness of this layer 120 is between about 1 nm and 10 nm, such that its conductivity enables the passage of a current, at one of the columns 110, between the face of the layer 120 that is not in contact with the stack of memory layers 106.1 to 106.3 and the insulating layers 108, and said column 110, without short circuiting the other columns 110. The tribology layer 120 reduces wear of the microdots 112 compared with a direct contact of the microdots 112 with the columns 110. For example, the conductivity of the layer 120 is between about $0.1\,(\Omega\cdot cm)^{-1}$ and $100\,(\Omega\cdot cm)^{-1}$. In one variant, the layer 120 may also be an insulating layer, for example based on alumina, for which the thickness, for example equal to about 1 nm, is chosen so as to obtain a tunnel effect between this layer 120 and the columns 110. Finally, the layer 120 may also be based on a conducting organic material such as polyaniline (PANI).

The device 100 also comprises means 115 of selecting memory layers 106.1 to 106.3, that may be associated with means for applying voltage to the terminals of memory layers 106.1 to 106.3, such as an addressing circuit for example fixing the potential of <<non active>> memory layers 106.1 to 106.3, in other words the memory layers 106.1 to 106.3 in which no information will be read and/or written. For example, this potential may be equal to the potential applied by a microdot 112 to one of the columns 110, for example a zero potential. The addressing circuit polarises one of the selected memory layers 106.1 to 106.3, in which information will be read and/or written.

The device 100 also comprises means 118 of measuring the current, arranged at the substrate 102. On the example in FIG. 1A, the current measurement means 118 are connected to means 115 of selecting memory layers. Means 118 of measuring the current may comprise logical means address selection such as a multiplexer, taking account of the box structure of memory layers 106.1 to 106.3 and insulating layers 108. The current measurement means 118 may comprise at least one integrated amplifier and a current/voltage converter, a threshold comparator, and a charge/voltage converter used to discriminate a logical level related to the measured current.

Figure 1B:
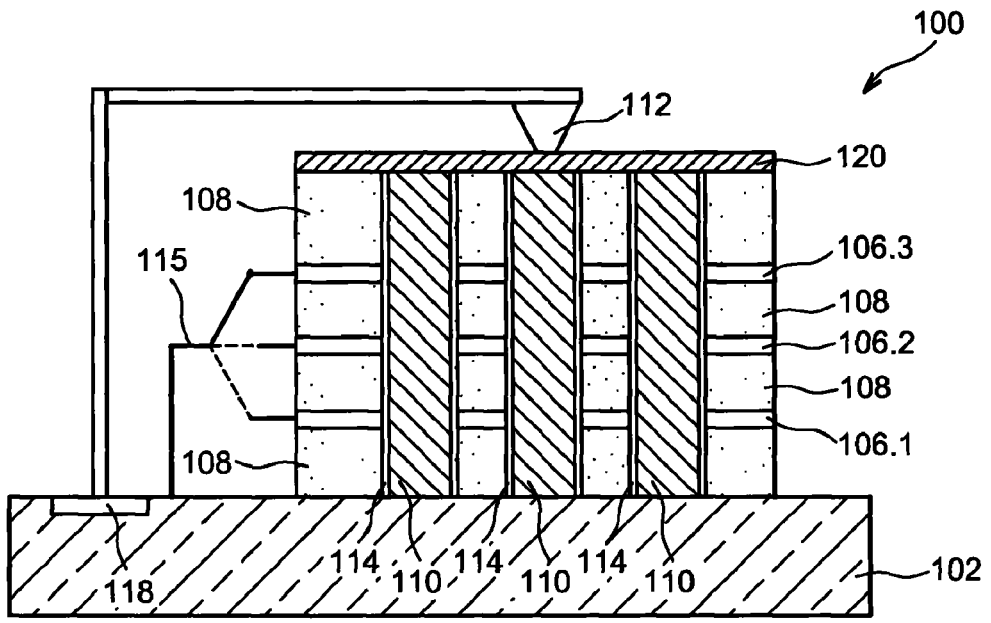

FIG. 1B shows a sectional view of a part of a data memorisation device 100 according to a second variant of the first embodiment.

In this variant, the current measurement means 118 arranged at the substrate 102 are connected to the microdot 112. The current measurement means 118 may be common to all columns 110 addressed by one of the microdots 112, for example common to all columns 110 located in the same box 116.

We will now describe an operation to write a bit into a memorisation element of the device 100 in FIG. 1B.

The column 110, for example in which the information bit is to be stored, is selected by placing one of the microdots 112 in contact with this column 110. The microdot 112 then applies a voltage, for example a zero voltage, to one end of the column 110. One of the memory layers 106.1 to 106.3 in which it is required to write a bit is then selected by the memory layer selection means. When the memory layer considered is polarised even temporarily with respect to the microdot 112, a current circulates from said memory layer to the column 110. The memory layer is therefore also an electrode during a read operation or a write operation in a memorizing element of the device.

This current causes a temperature rise due to the Joule effect that is concentrated in the vicinity of the column 110, at the memory layer, since this is the location at which the current density is highest and the thermal exchange surface is lowest. Around this interface, if the voltage is sufficiently high, the phase change material of the memory layer may then be heated to a temperature exceeding its melting temperature (for example 650° C. for a memory layer based on GeSbTe) so that during sudden cooling, for example when the passage of current is stopped, the phase change material that was initially in the crystalline state, locally changes to an amorphous state with low conducting capacity. A ring of amorphous material is thus formed around the column 110 and physically forms the information bit. Since the material conducts less well when it is in the amorphous state, it will then limit the passage of current between the microdot 112 and the memory layer containing the material in the amorphous state.

The information can then be read by the current measurement means 118 circulating from the microdot 112 and/or in the memory levels 106. To achieve this, the memory layer concerned is polarised with respect to the microdot 112 to a sufficiently low voltage to avoid the risk of increasing the temperature of the material sufficiently to (re)crystallise it. It is then possible to determine whether or not there is a ring of amorphous material present around the column 110, at the selected memory layer, from the measured current.

The conducting state of the memory layer depends on the size of the amorphous zone. Thus, it is possible to code information in binary form or in bit form composed of several layers (discretised bit) in a single memory layer and around a single column 110, the possible size of the amorphous zone depending on the power of the Joule effect during writing (active parameter) and the thermal conductivity of the material from which the columns are made.

Information at the intersection of a column 110 and one of the memory layers 106.1 to 106.3 is erased using a higher current for a sufficient time to enable the temperature to rise to the crystallisation temperature and for the volume of the amorphous material to return to the crystalline state, by heating it to a so-called <<crystallisation>> temperature, for example greater than about 170° C. for GeSbTe.

The read and write access time of the memorisation device 100 can be optimised by grouping information into words, for example with 8, 16 or 32 bits, each word being written in all memory layers 106.1 to 106.3, at a single column 110. The number of column memorisation levels, in other words the number of memory layers included in the memorisation device 100, can therefore be adapted as a function of the required size of written or read information words.

A data memorisation device 200 according to a second embodiment will now be described with reference to FIGS. 2A and 2B.

Compared with the device 100 shown in FIGS. 1A and 1B, each of the memory layers of the device 200 is formed from several parts isolated from each other by the insulating material of the insulating layers 108. In the example shown in FIGS. 2A and 2B, the memory layer 106.1 of FIGS. 1A and 1B comprises the three parts 106.11 to 106.13, the memory layer 106.2 comprising the three parts 106.21 to 106.23 and the memory layer 106.3 comprising the three parts 106.31 to 106.33. Each of these parts of the memory layer 106.11 to 106.33 has an approximately rectangular shape in the (x, z) plane.

As in the device 100 according to the first embodiment, the device 200 memorises information by changing the phase of the material of the parts of the memory layers 106.11 to 106.33, at the columns 110. A single box 116 comprising nine columns 110 is shown in the example in FIGS. 2A and 2B.

In this second embodiment, the columns 110 are not identified by microdot means, but by conducting lines 202.1 to 202.3 arranged on the substrate 102 under the columns 110. The box 116 shown in FIGS. 2A and 2B comprises three conducting lines 202.1 to 202.3, each of these conducting lines 202.1 to 202.3 being in contact with three columns 110, each of these three columns 110, being in contact with three distinct parts of memory layers 106.11 to 106.33.

Thus, each memory dot on the device 200 is located at the intersection of one of the selected parts of the memory layers 106.11 to 106.33 and one of the selected conducting lines 202.1 to 202.3. The parts of memory layers 106.11 to 106.33 and the conducting lines 202.1 to 202.3 are selected by an electronic multiplexing circuit, not shown in FIGS. 2A and 2B, integrated on the substrate 102 of the device 200, for example made using the CMOS technology. Writing, reading and erasing information in the device 200 is done by the same memory material phase change phenomenon, by applying a voltage between one of the parts of the memory layers 106.11 to 106.33 and one of the conducting lines 202.1 to 202.3.

Figure 3A:
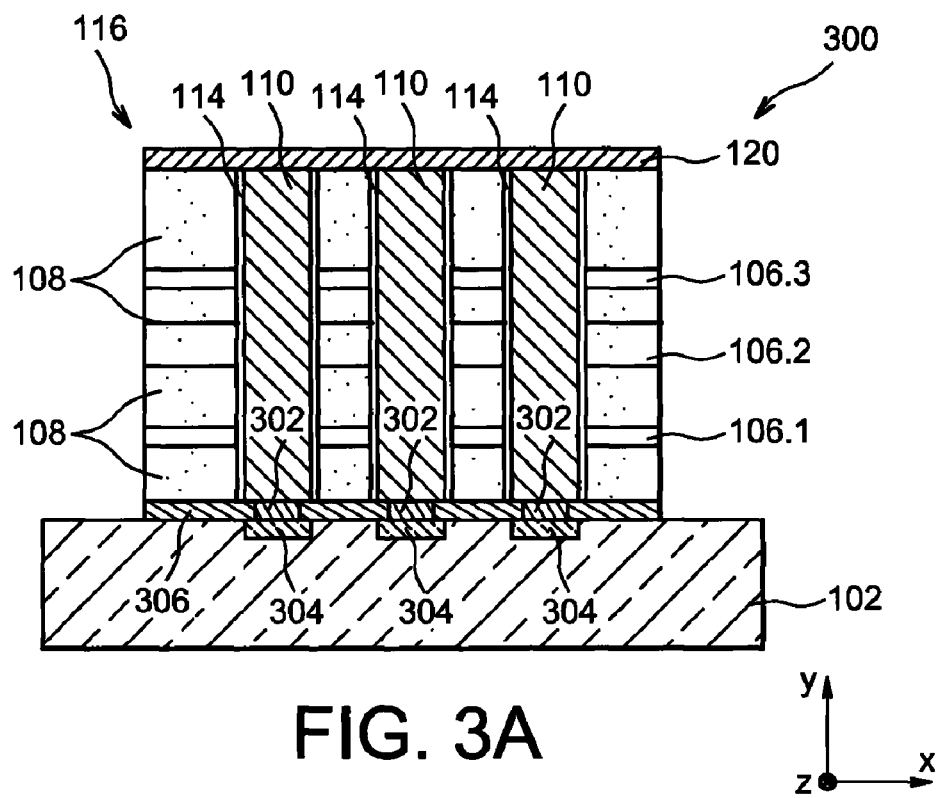
FIGS. 3A and 3B show sectional views along planes perpendicular to each other, of a memorisation device according to a third embodiment of this invention.
Figure 3B:
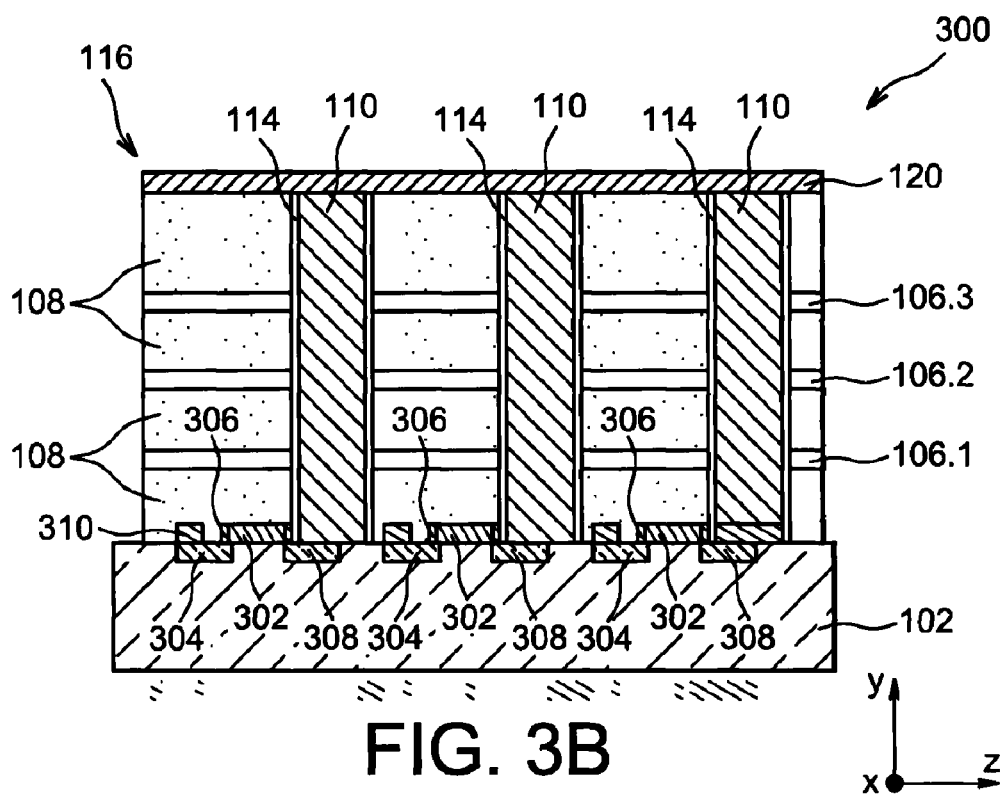

We will now describe a data memorisation device 300 according to a third embodiment, with reference to FIGS. 3A and 3B.

As in the first embodiment, the device 300 comprises memory layers 106.1 to 106.3 separated from each other by insulating layers 108.

Compared with the first embodiment, the device 300 does not contain microdots for addressing the columns 110. In this third embodiment, a transistor is present at the <<bottom>> of each column 110. The transistor grids 302 are located on the same line as shown in FIG. 3A, and are connected to each other by a grid conductor 306. in this example embodiment, three grid conductors are present in each box 116 comprising three lines of three columns 110. Each transistor comprises source zones 304 and drain zones 308 made in the substrate 102. As shown in FIG. 3B, each drain zone 308 of the transistors is in contact with the column 110 adjacent to the transistor. Finally, conducting portions 310 perpendicular to the grid conductors 306 connect each source zone 304 to a multiplexing circuit. Conducting portions shown on the example in FIG. 3B are connected to each other, forming a line conductor along the direction orthogonal to the grid conductors 306.

Thus, the grid conductors 306 and the line conductor form a matrix capable of addressing a single column, for example in a box. By multiplexing the grid conductors, all transistors of a line considered can be made to conduct, by polarising their grid by a voltage applied to the grid conductor. Then, by multiplexing the line conductor, it is possible to select a column in which it is required to write, read or erase information, in the polarised transistor line. These two multiplexing operations may be done by an electronic multiplexer not shown. This multiplexer may also be used to put the current detection circuit, not shown in FIGS. 3A and 3B, to quantify the state of the memory read.

We will now describe a method of making a memorisation device with reference to FIGS. 4A to 4E.

Figure 4A:
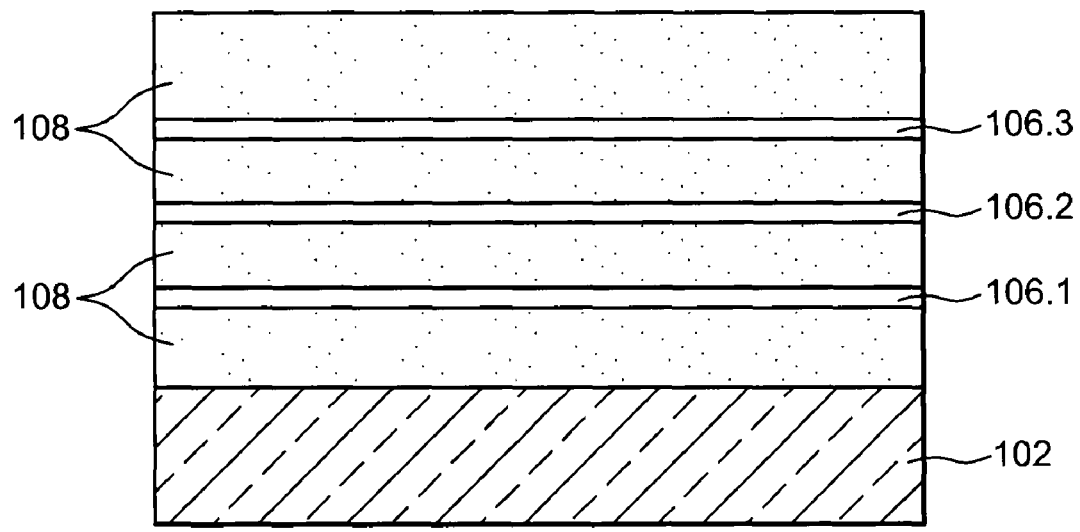
FIGS. 4A to 4E show steps in a method, also a subject of this invention, of producing a memorisation device according to a first embodiment.

As shown in FIG. 4A, the first step is to make a stack on the substrate 102 formed from insulating layers 108 and memory layers 106.1 to 106.3. These insulating layers 108 and these memory layers 106.1 to 106.3 may for example be made by successive deposits of the same nature, such as a PVD (physical vapour phase deposit). The substrate 102 may also comprise a technological layer before the stack is made, for example comprising means for measuring the current 118 shown in FIGS. 1A and 1B and/or addressing transistors and/or grid conductors 306 and/or line conductors in FIGS. 3A and 3B, and/or line conductors 202.1 to 202.3 in FIGS. 2A and 2B, depending on the type of memorisation device made.

It is possible to perform a mechanical-chemical planarising step of the deposited layer, between one or several steps to deposit a layer of the stack (isolating or memory layer).

Figure 2A:
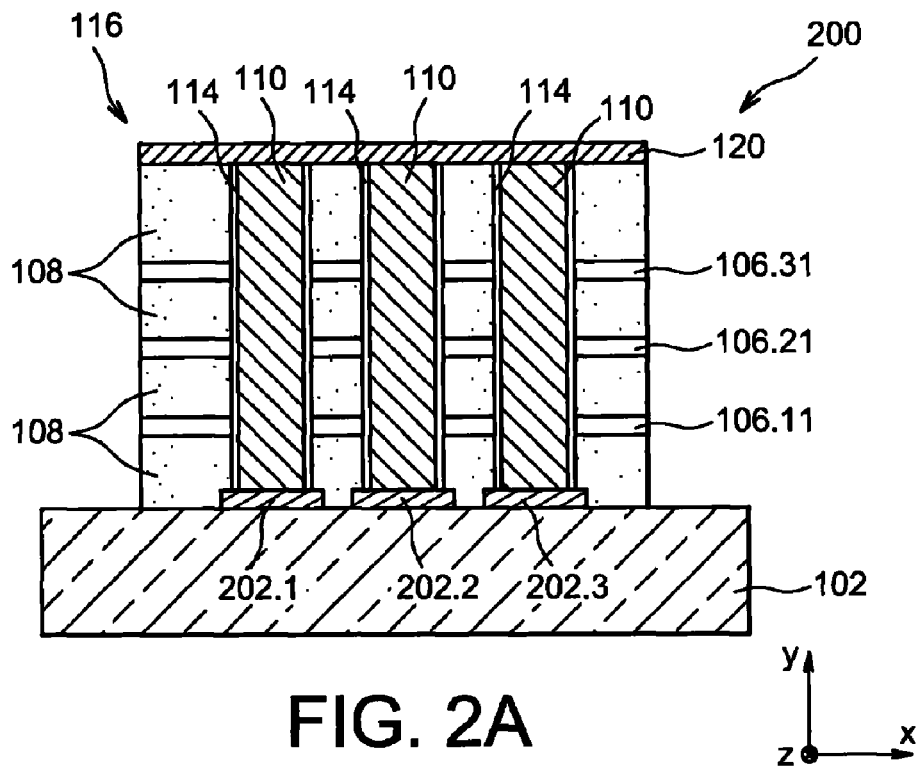
FIGS. 2A and 2B show sectional views along planes perpendicular to each other, of a memorisation device according to a second embodiment of this invention.
Figure 2B:
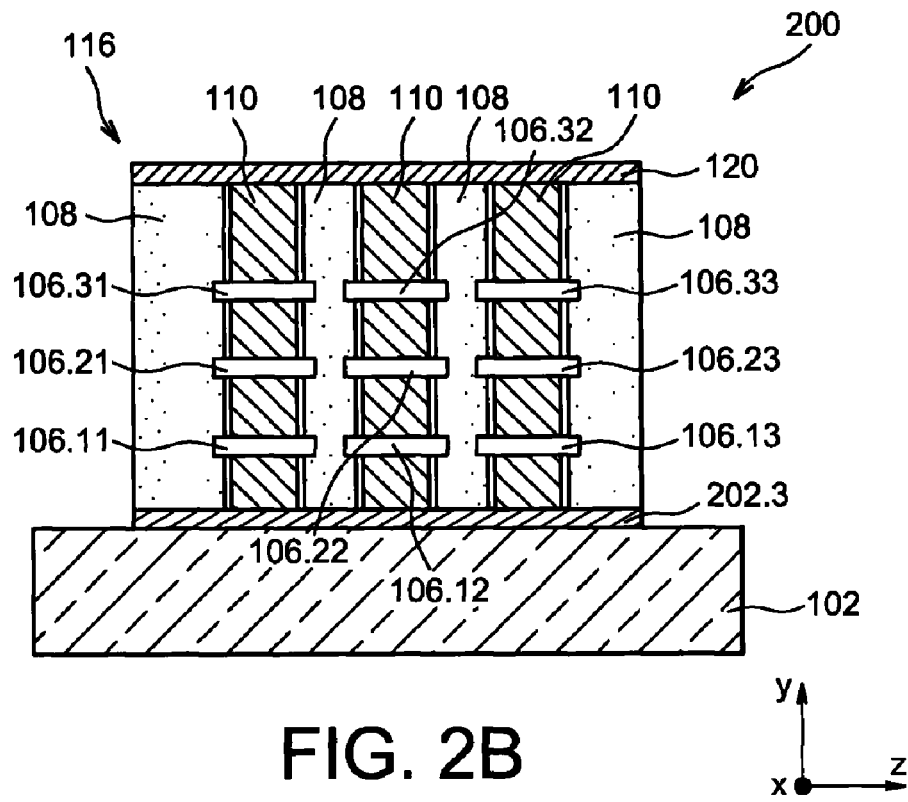

For example, if the memorisation device made is similar to the device 200 shown in FIGS. 2A and 2B, then the method comprises an additional photolithography and etching step after each deposit of a memory layer during production of the stack, so as to make the isolated parts of the memory layers shown in FIGS. 2A and 2B.

Preferably, the first layer and the last layer of the stack deposited on the substrate 102 are insulating layers 108.

Figure 4B:
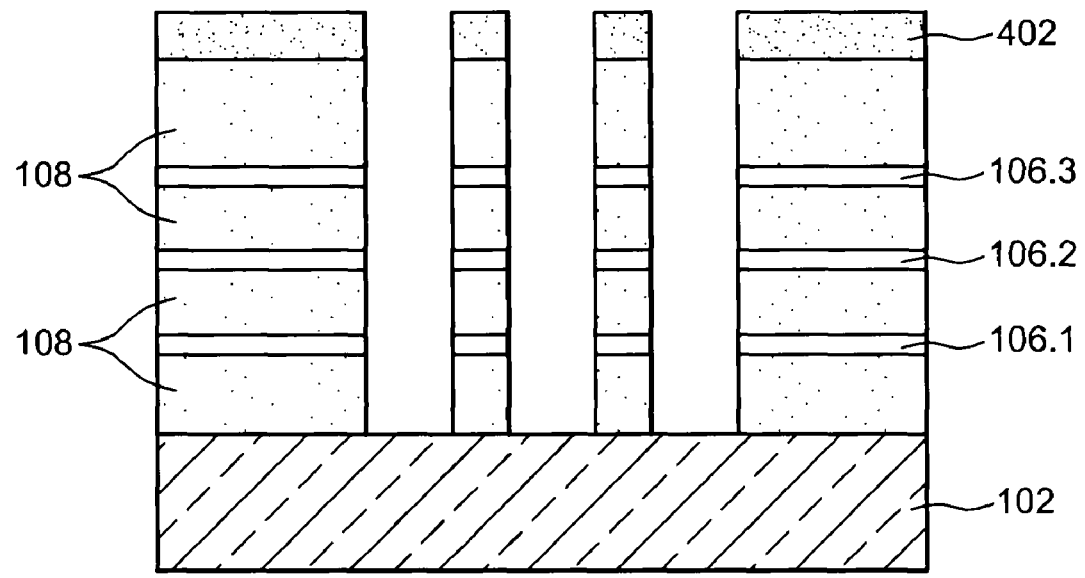

The next step is to structure the stack by depositing a lithography mask 402 on the stack, and then by etching, for example reactive ionic etching RIE, of the stack of insulating layers 108 and memory layers 106.1 to 106.3 (FIG. 4B). This structuring step is used to make holes, future locations of the columns 110 of the memorisation device, and possibly to structure the memorisation device in boxes. For example, the mask 402 may be a layer of photosensitive resin, exposed through a mask or a layer based on a plastic material and deformed by a moulding process. The mask 402 is used to transfer the pattern defining the location of columns in the stack and the distribution of boxes in the stack by an etching process, such as ionic etching or reactive ion etching.

Figure 4C:
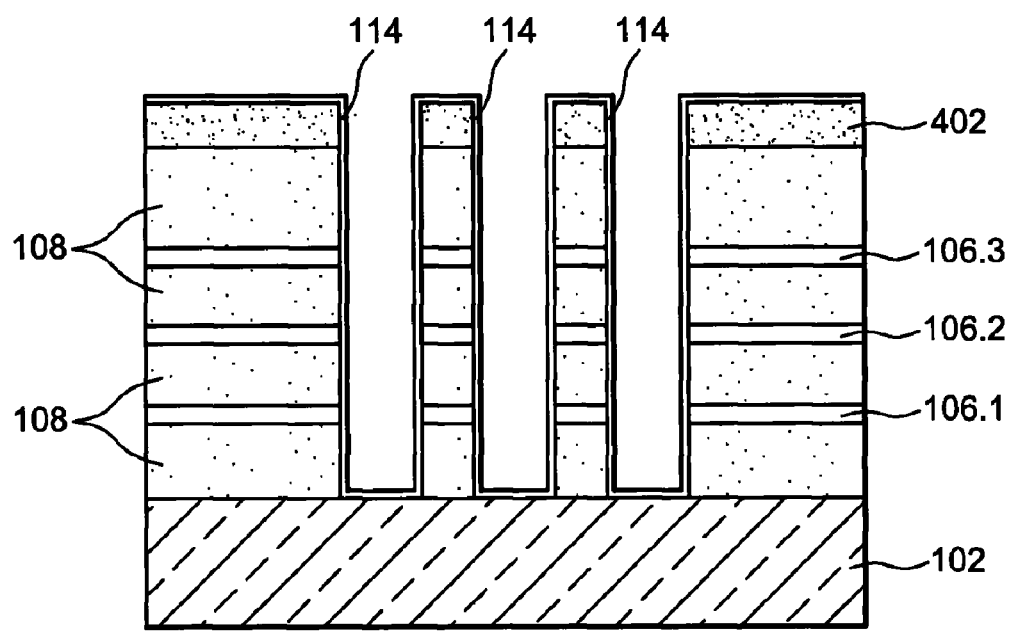

As shown in FIG. 4C, the diode structures 114 intended to be arranged around the columns 110 are made. The diode junctions 114 may for example be made using a Schottky structure with a semiconducting material such as polycrystalline silicon, deposited by CVD (chemical vapour phase deposition).

Figure 4D:
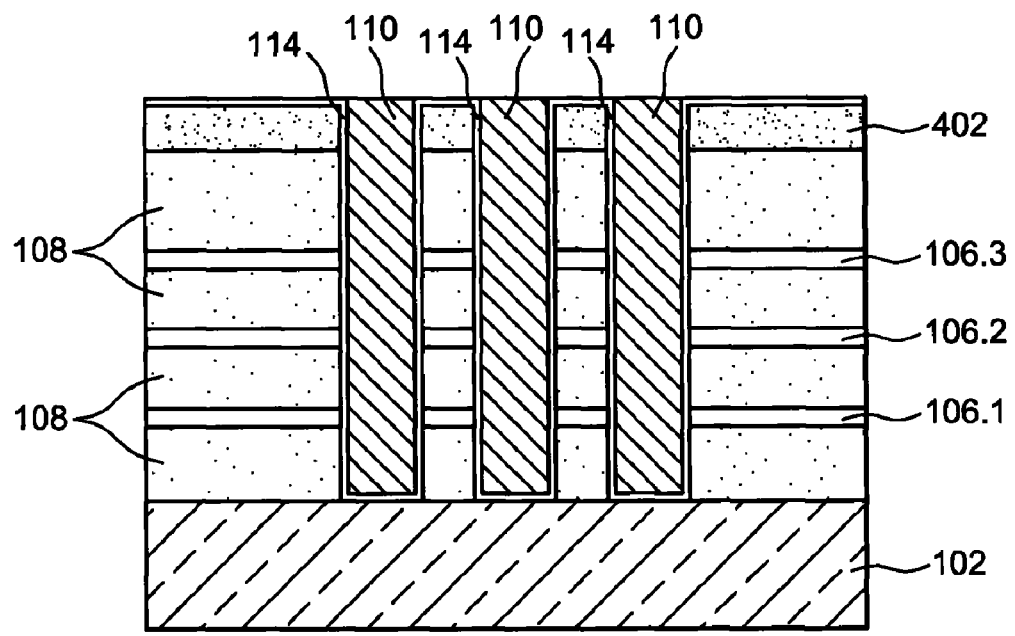

The next phase is to make the columns 110 in the previously made holes, for example by electrochemical deposition or by growth of carbon nanotubes or semiconducting nanowires starting from a catalyst, to obtain columns 110 for which the dimension along the direction of the stack is large compared with the dimensions in the plane of the stack layers, in other words forming long and thin columns (FIG. 4D).

Production of columns by the growth of nanotubes or nanowires is particularly useful to make a diode structure in series within the columns, by progressively growing N and P doped layers. In the case of columns made by growth of silicon nanowires, such a diode structure may be obtained by alternating gases interacting during the VLS (Vapour-Liquid-Solid) growth, in addition to the silane used, for example such as arsine and phosphine, in order to make P and N doping respectively.

Figure 4E:
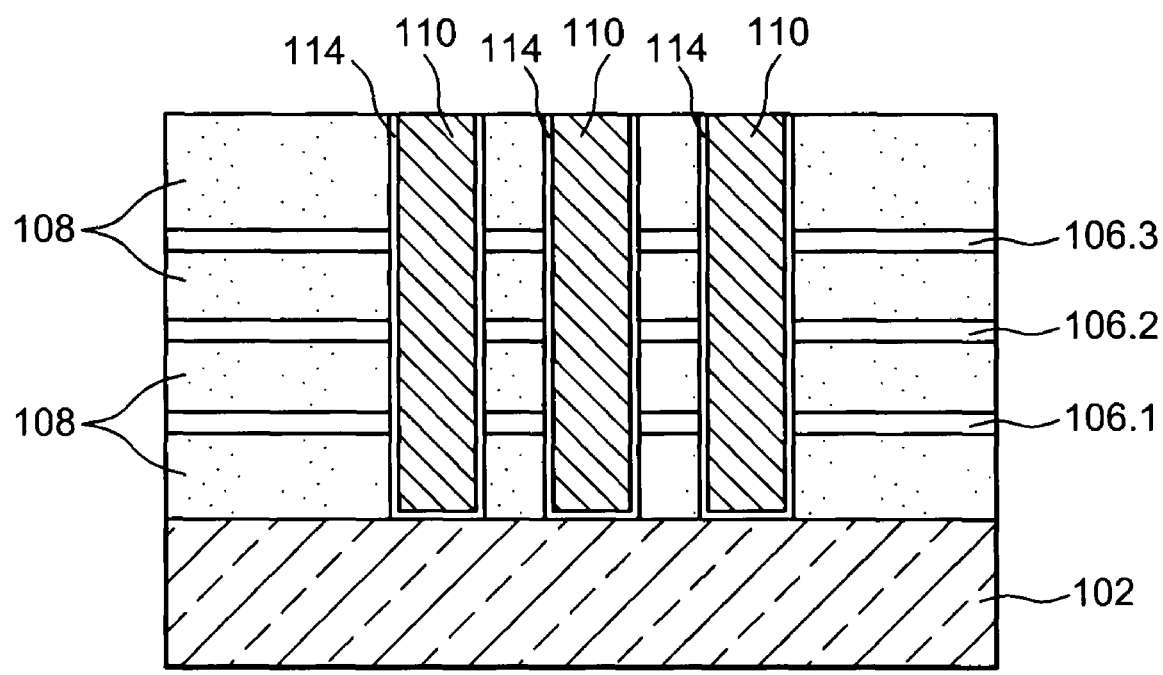

As shown in FIG. 4E, the next step is to withdraw the mask 402 and deposition materials of the columns 110 and diode structures 114 located on the mask 402, for example by mechanical-chemical polishing of the device.

Finally, the data memorisation device is terminated by depositing a <<tribology>> layer, for example similar to the layer 120 shown in FIGS. 1A and 1B by sputtering of carbon, possibly containing metallic impurities.

In the case of production of a memorisation device similar to the device in the first embodiment, the structure made is then coupled to MEMS type microdots used for addressing columns.

According to one variant of this manufacturing method, it is possible to start by growing silicon nanowires or carbon nanotubes on the substrate 102, forming the columns 110. When the substrate 102 is based on silicon with crystalline orientation (111), the nanowires obtained by growth are oriented approximately perpendicular to the face of the substrate 102 on which growth takes place. When the substrate 102 is based on silicon with crystalline orientation (100), the nanowires obtained by growth are no longer oriented approximately perpendicular to said substrate face 102, so that subsequently it is possible to obtain columns that are not perpendicular to said substrate face 102. The stack of insulating layers 108 and memory layers 106.1 to 106.3 is then made around the columns 110 by successive and alternate deposits of these layers, for example by PVD (physical vapour phase deposition).

The invention claimed is:

1. A data memorization device comprising at least:
   a stack of layers including at least one memory layer based on a phase change material arranged between at least two insulating layers, placed on a substrate,
   a plurality of columns arranged in the stack of layers, and passing through each layer of the stack, each of the columns being based on at least one electrically conducting material, and a plurality of memorization elements formed by annular portions of the at least one memory layer surrounding the columns.

2. The device according to claim 1, wherein the insulating layers are based on at least one of silica, silicon nitride, and zinc sulphide.

3. The device according to claim 1, wherein the phase change material includes a chalcogenide.

4. The device according to claim 1, wherein the columns include at at least one of Cu, TiN, W, a semiconductor, carbon nanotubes, and semiconductor nanowires.

5. The device according to claim 1, further comprising a diode sandwiched between each memory layer and each column.

6. The device according to claim 1, further comprising diodes arranged in the columns, at the insulating layers.

7. The device according to claim 1, wherein the stack of layers includes an alternation of insulating layers and memory layers.

8. The device according to claim 1, wherein each of the plurality of columns pass through all layers of the stack, forming several portions, isolated from each other.

9. The device according to claim 1, wherein each of the memory layers includes several parts electrically isolated from each other.

10. The device according to claim 1, also comprising means for applying voltage at a terminal of a column.

11. The device according to claim 10, wherein the means for applying voltage at the terminal of the column includes a network of mobile microdots.

12. The device according to claim 11, also comprising at least one partially conducting layer arranged on the stack of layers and on summits of the columns.

13. The device according to claim 10, wherein said means for applying voltage at the terminal of the column includes a network of conducting lines in contact with the columns.

14. The device according to claim 10, wherein said means for applying voltage at the terminal of the column includes a network of transistors.

15. The device according to claim 10, wherein said means for applying a voltage to the terminal of the column includes a multiplexing circuit.

16. The device according to claim 1, also comprising means for applying voltage to a terminal of a memory layer.

17. The device according to claim 1, also comprising means for selecting one or several columns.

18. The device according to claim 17, wherein said means for selecting one or several columns is used by a multiplexing electronic circuit.

19. The device according to claim 1, also comprising means for measuring current.

20. The device according to claim 19, wherein said means for measuring current includes means for address selection.

21. The device according to claim 1, also comprising means for selecting one or several memory layers.

22. The device according to claim 1, wherein the phase change material includes at least one of GeSbTe and AgInSbTe.

23. The device according to claim 20, wherein the means for address selection includes at least one of a multiplexer, an integrated amplifier, a current / voltage converter, a threshold comparator, and a charge/voltage converter.

24. The device according to claim 1, wherein each column is surrounded by a diode.

25. The device according to claim 1, further comprising cylindrical contact zones between the plurality of columns and the at least one memory layer.

26. The device according to claim 25, wherein each intersection of a column and the at least one memory layer forms the memorization element.

27. The device according to claim 26, wherein the phase change material in the at least one memory layer, initially in a crystalline state, forms an information bit by creating a ring of amorphous material around a column.

* * * * *